(12) United States Patent
Chang et al.

(10) Patent No.: US 11,164,788 B2
(45) Date of Patent: Nov. 2, 2021

(54) FINFETS AND METHODS OF FORMING FINFETS

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 185 days.

(21) Appl. No.: 15/961,387

(22) Filed: Apr. 24, 2018

(65) Prior Publication Data

US 2018/0240711 A1    Aug. 23, 2018

Related U.S. Application Data

(63) Continuation of application No. 15/286,280, filed on Oct. 5, 2016, now Pat. No. 9,953,874.
(Continued)

(51) Int. Cl.
  *H01L 21/8234* (2006.01)
  *H01L 29/66* (2006.01)
(Continued)

(52) U.S. Cl.
  CPC ......... *H01L 21/823431* (2013.01); *H01L 21/823418* (2013.01); *H01L 29/1054* (2013.01);
(Continued)

(58) Field of Classification Search
  CPC ..... H01L 21/823431; H01L 21/823418; H01L 29/785; H01L 29/1054; H01L 29/7848;
(Continued)

(56) References Cited

U.S. PATENT DOCUMENTS 9,121,890 B2    9/2015  Gu et al.
2002/0008289 A1*   1/2002  Murota ............... H01L 21/8238
                                                                                257/369
(Continued)

FOREIGN PATENT DOCUMENTS

CN    104126228 A    10/2014
CN    104584225 A    4/2015
(Continued)

*Primary Examiner* — Kyoung Lee
*Assistant Examiner* — Christina A Sylvia
(74) *Attorney, Agent, or Firm* — Slater Matsil, LLP

(57) ABSTRACT

An embodiment is a method including forming a multi-layer stack over a substrate, the multi-layer stack including alternating first layers and second layers, patterning the multi-layer stack to form a fin, forming an isolation region surrounding the fin, an upper portion of the fin extending above a top surface of the isolation region, forming a gate stack on sidewalls and a top surface of the upper portion of the fin, the gate stack defining a channel region of the fin, and removing the first layers from the fin outside of the gate stack, where after the removing the first layers, the channel region of the fin includes both the first layers and the second layers.

20 Claims, 34 Drawing Sheets

Related U.S. Application Data

(60) Provisional application No. 62/328,868, filed on Apr. 28, 2016.

(51) Int. Cl.
    *H01L 29/78*     (2006.01)
    *H01L 29/10*     (2006.01)

(52) U.S. Cl.
    CPC .. *H01L 29/66545* (2013.01); *H01L 29/66795* (2013.01); *H01L 29/785* (2013.01); *H01L 29/7848* (2013.01)

(58) Field of Classification Search
    CPC ......... H01L 29/66795; H01L 29/66545; H01L 29/7855
    See application file for complete search history.

(56) References Cited

U.S. PATENT DOCUMENTS

| | | | | |
|---|---|---|---|---|
| 2005/0145941 A1* | 7/2005 | Bedell | ............... | H01L 29/66795 257/348 |
| 2009/0090934 A1* | 4/2009 | Tezuka | ............... | H01L 27/1211 257/190 |
| 2011/0024794 A1* | 2/2011 | Ko | ............... | H01L 29/66795 257/190 |
| 2013/0045580 A1 | 2/2013 | Cho | | |
| 2013/0065371 A1 | 3/2013 | Wei et al. | | |
| 2014/0091279 A1 | 4/2014 | Kachian et al. | | |
| 2014/0175554 A1 | 6/2014 | Loubet et al. | | |
| 2014/0191297 A1* | 7/2014 | Utomo | ............... | H01L 29/0847 257/288 |
| 2014/0225065 A1* | 8/2014 | Rachmady | ......... | H01L 29/42392 257/24 |
| 2015/0060997 A1 | 3/2015 | Basu et al. | | |
| 2015/0372104 A1* | 12/2015 | Liu | ............... | H01L 29/42364 257/77 |
| 2016/0049489 A1* | 2/2016 | Wan | ............... | H01L 29/66545 257/347 |
| 2016/0079422 A1* | 3/2016 | Rachmady | ............ | H01L 29/785 257/29 |
| 2016/0365411 A1* | 12/2016 | Yeh | ............... | H01L 29/0673 |

FOREIGN PATENT DOCUMENTS

| | | |
|---|---|---|
| TW | 201332111 A1 | 8/2013 |
| TW | 201535492 A | 9/2015 |
| TW | 201535727 A | 9/2015 |

* cited by examiner

FINFETS AND METHODS OF FORMING FINFETS

PRIORITY CLAIM

This application is a continuation of U.S. patent application Ser. No. 15/286,280, entitled "FINFETS and Methods of Forming FINFETS," filed on Oct. 5, 2016, which claims the benefit of U.S. Provisional Application No. 62/328,868, entitled "FINFETS AND METHODS OF FORMING FINFETS," filed on Apr. 28, 2016, which applications are hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. However, there are challenges to implementation of such features and processes in semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
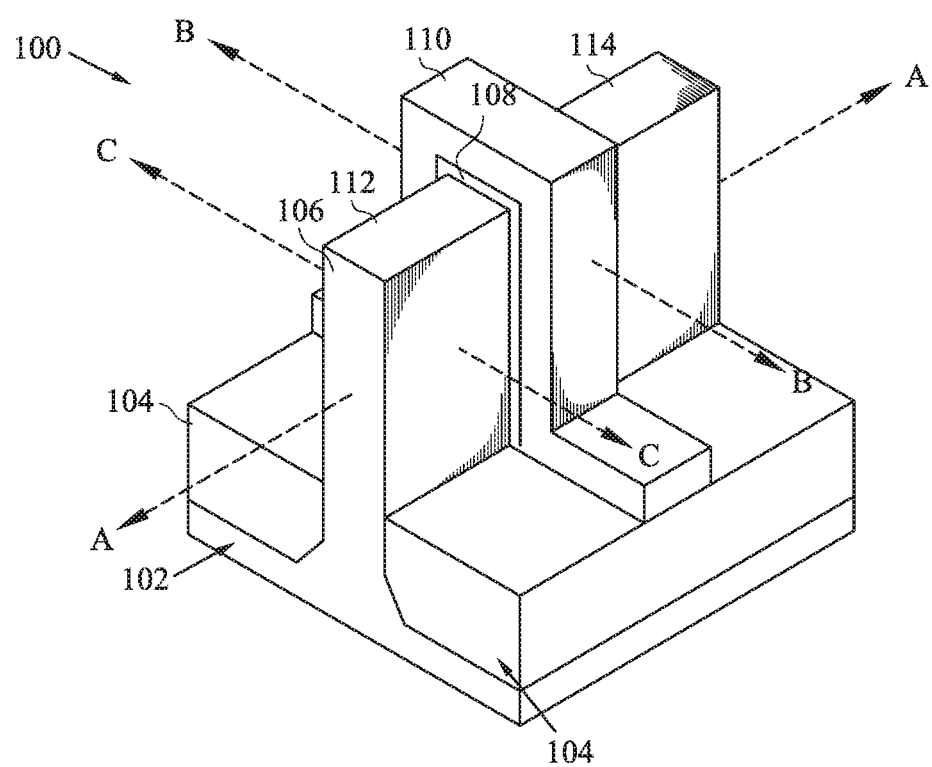
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last (sometimes referred to as replacement gate process) process. In other embodiments, a gate-first process may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to improve the reliability of FinFET devices by improving the fin patterning process. In addition, this process flow may improve the loading of the fin recess process when recessing the fins for the source/drain regions. In particular, embodiments such as those disclosed below include a process flow that utilizes a multi-layered fin in the channel region (e.g. underneath the gate stack) and air gaps or voids outside of the channel region. These voids/air gaps between layers allows for the improvement of the etch process when recessing the fin for the source/drain regions. Further, performing a fin cut process on multi-layered fins causes less stress on the fins as compared to fins comprising a single layer of material. These improvements in the fin cut process and the recessing steps can improve the reliability, leakage, and yield of the FinFET device.

Some embodiments contemplate both n-type devices, such as n-type FinFETs, and p-type devices, such as p-type FinFETs, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIG. 1 illustrates an example of a FinFET 100 in a three-dimensional view. The FinFET 100 includes a fin 106 on a substrate 102. The substrate 102 includes isolation regions 104, and the fin 106 protrudes above and from between neighboring isolation regions 104. A gate dielectric 108 is along sidewalls and over a top surface of the fin 106, and a gate electrode 110 is over the gate dielectric 108. Source/drain regions 112 and 114 are disposed in opposite sides of the fin 106 with respect to the gate dielectric 108 and gate electrode 110. FIG. 1 further illustrates reference cross-sections that are used in later figures. Cross-section B-B is across a channel, gate dielectric 108B, and gate electrode 110 of the FinFET 100. Cross-section C-C is parallel to cross-section B-B and is across a source/drain region 112 Cross-section A-A is perpendicular to cross-section B-B and is along a longitudinal axis of the fin 106 and in a direction of, for example, a current flow between the source/drain regions 112 and 114. Subsequent figures may refer to this reference cross-section for clarity.

FIGS. 2-5, 6A-6B, 7A-7C, 8A-8C, 9A-9C, 10A-10C, 11A-11C, 12A-12C, 13A-13C, 14A-14C, and 15A-15C are cross-sectional views of intermediate stages in the manufacturing of FinFETs in accordance with some embodiments. FIGS. 2 through 15C illustrate a FinFET similar to FinFET 100 in FIG. 1, except, in some figures, for multiple fins and multi-layered fins. FIGS. 2 through 5 illustrate views along cross-section B-B. In FIGS. 6A through 15C, figures ending with an "A" designation illustrate cross-section A-A, figures ending with a "B" designation illustrate cross-section B-B, and figures ending with a "C" designation illustrate cross-section C-C.

Figure 2:
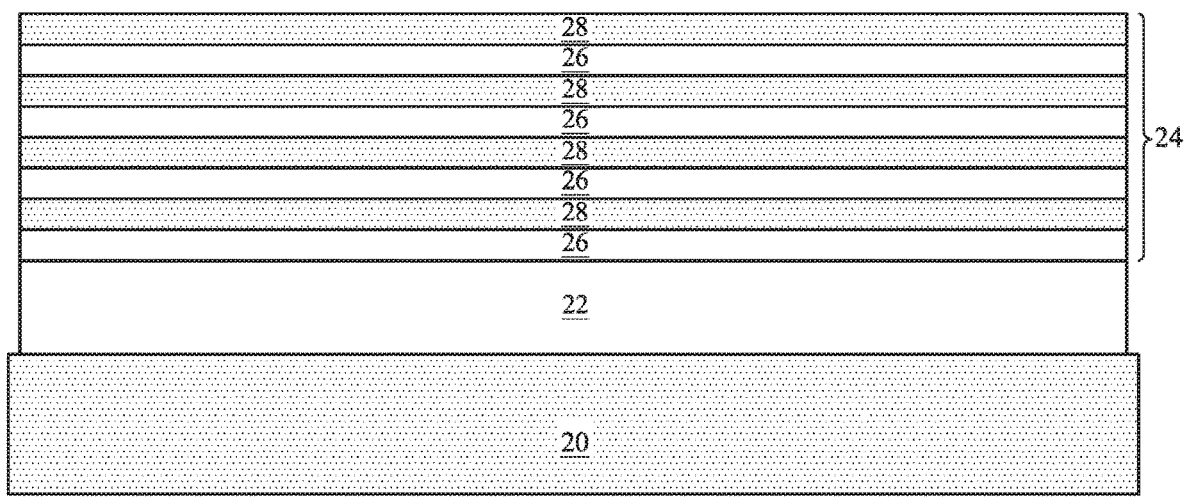
FIGS. 2-5, 6A-6B, 7A-7C, 8A-8C, 9A-9C, 10A-10C, 11A-11C, 12A-12C, 13A-13C, 14A-14C, and 15A-15C are cross-sectional views of intermediate stages in the manufacturing of FinFETs in accordance with some embodiments.

FIG. 2 illustrates a substrate 20 with a layer stack 24 over the substrate 20. The substrate 20 may be a semiconductor substrate, such as a bulk semiconductor substrate, a semiconductor-on-insulator (SOI) substrate, a multi-layered or gradient substrate, or the like. The substrate 20 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 20 may be doped or undoped. In a specific example, the substrate 20 is a bulk silicon substrate, which may be a wafer.

Further in FIG. 2, a buffer layer 22 and a layer stack 24 are formed over the substrate 20. The buffer layer 22, in some embodiments, is epitaxially grown on the substrate 20. The epitaxial growth can use Metal-Organic Chemical Vapor Deposition (MOCVD), Molecular Beam Epitaxy (MBE), Liquid Phase Epitaxy (LPE), Vapor Phase Epitaxy (VPE), Ultra-High-Vacuum Chemical Vapor Deposition (UHVCVD), the like, or a combination thereof. The buffer layer 22 can be a group IV material, such as Si, Ge, SiGe, SiGeSn, or the like; a group III-group V compound material, such as GaAs, GaP, GaAsP, AlInAs, AlGaAs, GaInAs, InAs, GaInP, InP, InSb, GaInAsP or the like; or the like. The buffer layer 22 can be a crystalline material and can have a natural lattice constant that is mismatched to the natural lattice constant of the crystalline material of the substrate 20 on which the buffer layer 22 is grown. The buffer layer 22 can be a relaxed material, which may result from plastic relaxation, for example. The buffer layer 22 can have a uniform composition or a varying composition, such as a graded composition. A graded composition may be substantially linearly graded or discrete-step graded. The buffer layer 22 can have a thickness greater than a critical thickness such that a surface of the buffer layer 22 distal from the substrate 20 includes a crystalline structure with a relaxed, natural lattice constant. The lattice constant at the surface of the buffer layer 22 distal from the substrate 20 can be as appropriate to induce stress in the layer stack 24, as will be discussed. In some embodiments, the buffer layer 22 can be omitted, such as if the substrate 20 is a crystalline material with a lattice constant appropriate to induce a desired stress in the layer stack 24. In the specific example referenced above, the buffer layer 22 is $Si_{0.75}Ge_{0.25}$ at the surface distal from the substrate 20, is relaxed, and has a thickness in a range from about 50 nm to about 500 nm, such as about 100 nm.

Although not specifically illustrated, appropriate wells may be formed in the buffer layer 22 and/or substrate 20. For example, a p-well may be formed in a first region of the substrate 20 where n-type devices, such as n-type FinFETs, are to be formed, and an n-well may be formed in a second region of the substrate 20 where p-type devices, such as p-type FinFETs, are to be formed.

For example, to form a p-well in the first region, a photoresist can formed over the buffer layer 22 in the second region of the substrate 20. The photoresist can be patterned to expose the first region of the substrate 20. The photoresist can be formed by using a spin-on technique and can be patterned using acceptable photolithography techniques. Once the photoresist is patterned, a p-type impurity implant can be performed in the first region, and the photoresist may act as a mask to substantially prevent p-type impurities from being implanted into the second region. The p-type impurities may be boron, $BF_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process.

Further, to form an n-well in the second region, a photoresist can be formed over the buffer layer 22 in the first region of the substrate 20. The photoresist can be patterned to expose the second region of the substrate 20. The photoresist can be formed by using a spin-on technique and can be patterned using acceptable photolithography techniques. Once the photoresist is patterned, an n-type impurity implant may be performed in the second region, and the photoresist may act as a mask to substantially prevent n-type impurities from being implanted into the first region. The n-type impurities may be phosphorus, arsenic, or the like implanted in the second region to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate the p-type and n-type impurities that were implanted. The implantations may form a p-well in the first region and an n-well in the second region.

In other embodiments, a p-well and an n-well may be formed in situ during the epitaxial growth of the buffer layer 22. The buffer layer 22 in the different regions where different wells are to be formed can be epitaxially grown in different growth steps to allow for the different doping types to be in the different regions.

Further in FIG. 2, the layer stack 24 is formed on the buffer layer 22. The layer stack 24 includes alternating first layers 26 and second layer 28. In some embodiments, the layer stack 24 may be a superlattice that includes strained layers, and may be referred to as superlattice 24. Each of the first layers 26 and the second layers 28, in some embodiments, is epitaxially grown on its underlying layer. The epitaxial growth can use MOCVD, MBE, LPE, VPE, UHVCVD, the like, or a combination thereof. Each of the first layers 26 and the second layers 28 can be a group IV material, such as Si, Ge, SiGe, SiGeSn, or the like; a group III-group V compound material, such as GaAs, GaP, GaAsP, AlInAs, AlGaAs, GaInAs, InAs, GaInP, InP, InSb, GaInAsP or the like; or the like. The layer stack 24 can include any number of first layers 26 and any number of second layers 28. As illustrated, the layer stack 24 has four first layers 26 and four second layer 28.

Each of the first layers 26 and the second layers 28 can be a crystalline material. In some embodiments, a natural lattice constant of one respective group of the first layers 26 or the second layers 28 is larger than the lattice constant of the surface of the buffer layer 22 distal from the substrate 20 (or the substrate 20 if the buffer layer 22 is omitted), and a natural lattice constant of the other one respective group of the first layers 26 or the second layers 28 is smaller than the lattice constant of the surface of the buffer layer 22 distal from the substrate 20 (or the substrate 20 if the buffer layer 22 is omitted). Hence, in these embodiments, the first layers 26 can be strained a first strain type, and the second layers 28 are strained a second strain type opposite from the first strain type. Further in these embodiments, each of the first layers 26 and the second layers 28 can have a thickness less than a critical thickness, such as in a range from about 3 nm to 20 nm.

In some embodiments, a natural lattice constant of the crystalline material of the first layer 26 is larger than the lattice constant of the surface of the buffer layer 22 distal from the substrate 20 (or the substrate 20 if the buffer layer 22 is omitted), and a natural lattice constant of the crystalline material of the second layer 28 is smaller than the lattice constant of the surface of the buffer layer 22 distal from the substrate 20 (or the substrate 20 if the buffer layer 22 is omitted). Hence, in these embodiments, the first layers 26 can be compressively strained, and the second layers 28 can be tensilely strained.

In other embodiments, a natural lattice constant of the crystalline material of the first layer 26 is smaller than the lattice constant of the surface of the buffer layer 22 distal from the substrate 20 (or the substrate 20 if the buffer layer 22 is omitted), and a natural lattice constant of the crystalline material of the second layer 28 is larger than the lattice constant of the surface of the buffer layer 22 distal from the substrate 20 (or the substrate 20 if the buffer layer 22 is omitted). Hence, the first layers 26 can be tensilely strained, and the second layers 28 can be compressively strained.

In the specific example referenced above, each of the first layers 26 is a layer of $Si_{0.50}Ge_{0.50}$, which has a natural lattice constant larger than the $Si_{0.75}Ge_{0.25}$ of the buffer layer 22, having a thickness less than a critical thickness, such as in a range from about 3 nm to 20 nm. Hence, in the specific example, the first layers 26 are compressively strained. Further in the specific example referenced above, each of the second layers 28 is a layer of Si, which has a natural lattice constant smaller than the $Si_{0.75}Ge_{0.25}$ of the buffer layer 22, having a thickness less than a critical thickness, such as in a range from about 3 nm to 20 nm. Hence, in the specific example, the second layers 28 are tensilely strained.

In further embodiments, one or both of the groups of the first layers 26 or the second layers 28 have a natural lattice constant of the respective crystalline material that is substantially equal to the lattice constant of the surface of the buffer layer 22 distal from the substrate 20 (or the substrate 20 if the buffer layer 22 is omitted). Hence, one or both of the groups of the first layers 26 or the second layers 28 can be relaxed. In some embodiments, the first layers 26 are each relaxed, while the second layers 28 are compressively or tensilely strained. In other embodiments, the second layers 28 are each relaxed, while the first layers 26 are compressively or tensilely strained. In further embodiments, each of the first layers 26 and the second layers 28 is relaxed.

In some embodiments, the material of the first layers 26 is different from the material of the second layers 28. The difference in materials may allow for the different strains as described above, and/or may allow for an etch selectivity between the first layers 26 and second layers 28, as will be apparent below.

Figure 3:
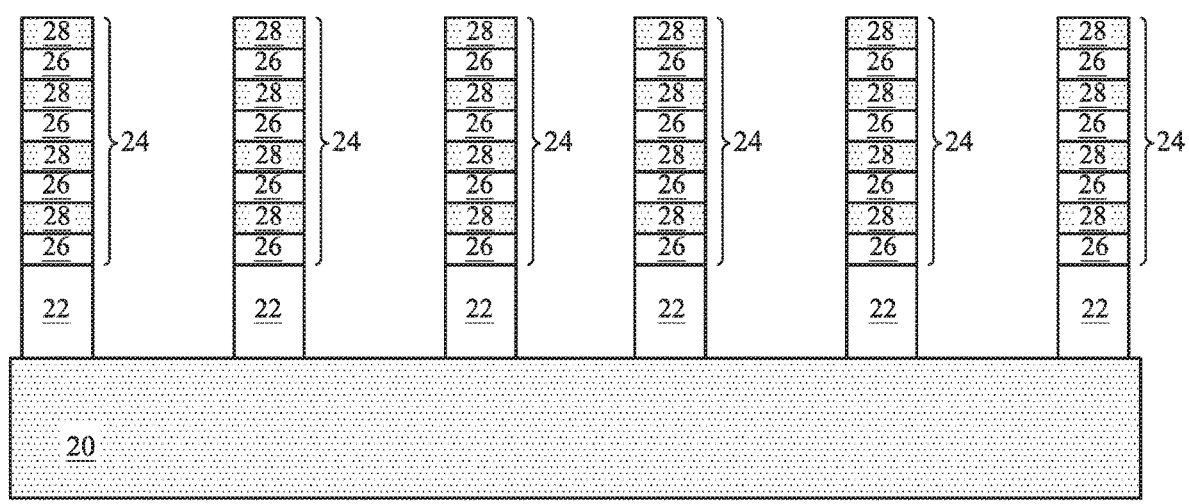

In FIG. 3, fins that include the layer stack 24 are formed by forming trenches in the layer stack 24 and on opposing sides of the fins. In some embodiments, the fins may be formed by etching the trenches through the layer stack 24 and into the buffer layer 22, but not completely through the buffer layer 22. In some embodiments, the trenches can extend through the layer stack 24 and the buffer layer 22 but not into the substrate 20. In some embodiments, the trenches can extend through the layer stack 24 and the buffer layer 22 and into the substrate 20. The etching may be any acceptable etch process, such as a reactive ion etch (RIE), neutral beam etch (NBE), the like, or a combination thereof. The etch may be anisotropic.

Figure 4:
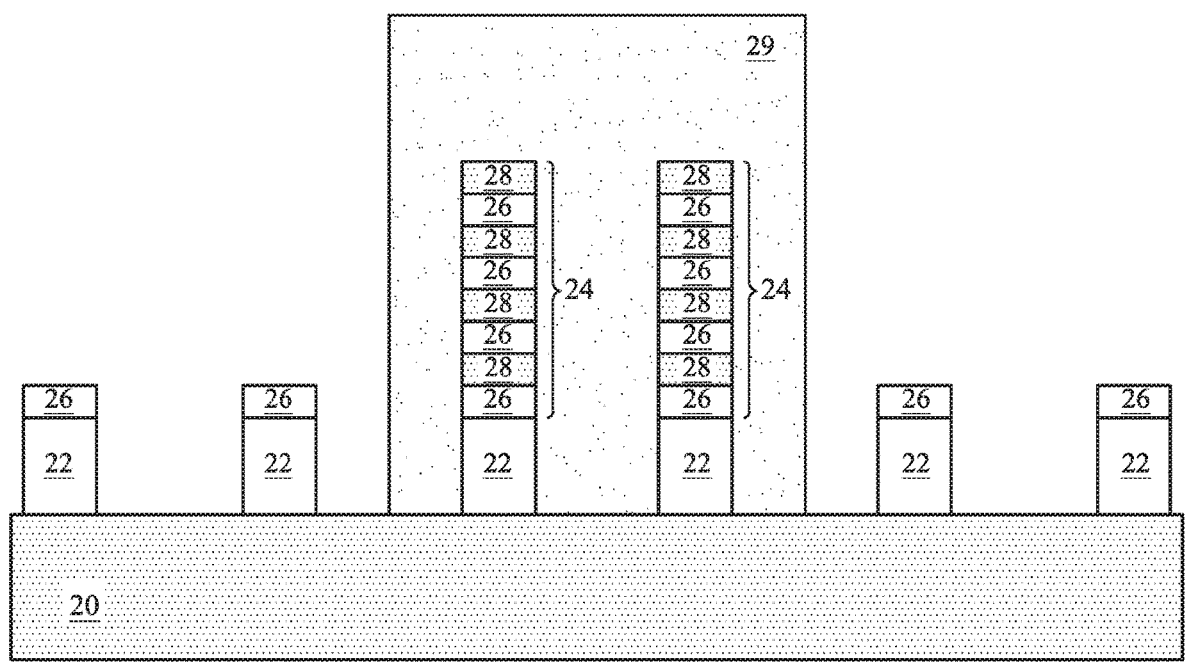

In FIG. 4, at least some of the fins are removed through a fin cut process. The fin cut process may utilize a mask 29. The mask 29 can be a photoresist or any suitable mask layer. In some embodiments, the fin cut process is a plasma dry etching process. In some embodiment, the fin cut process may be any acceptable etch process, such as a RIE, NBE, the like, or a combination thereof. The etch may be anisotropic. As illustrated, two fins remain after the fin cut process, but more or less fins could remain depending on the requirements of the structure. Further, as illustrated, one layer of the layer stack 24 (e.g. one first layer 26) remains on the fins that were cut but more layers of the layer stack 24 can remain. Performing the fin cut process on fins including the layer stack 24 causes less stress on the fins as compared to fins comprising a single layer of material.

Figure 5:
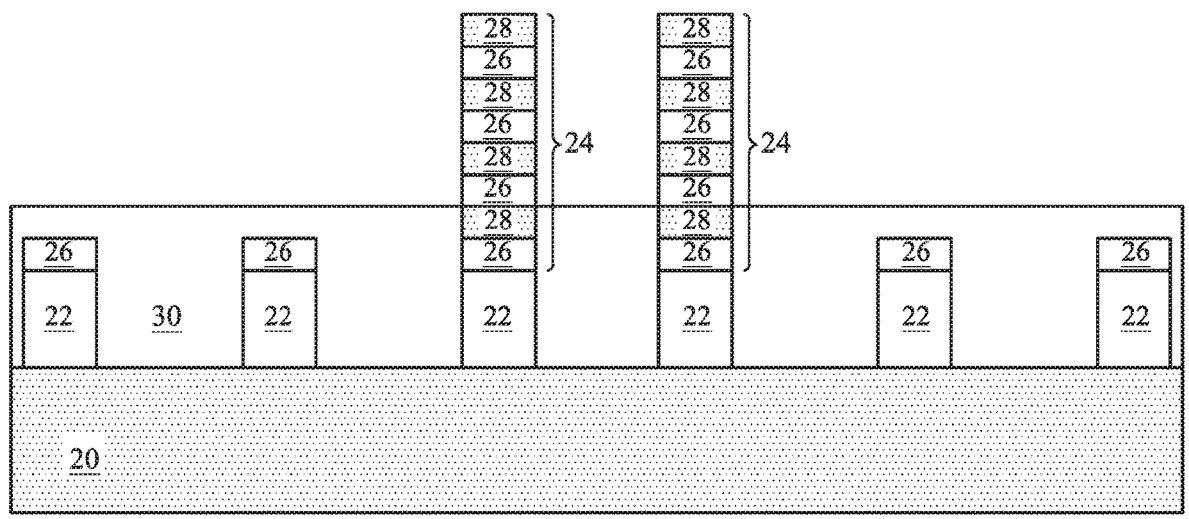

In FIG. 5, the trenches are filled with an insulation material 30. The insulation material 30 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 30 is silicon oxide formed by a FCVD process. An anneal process may be performed once the insulation material 30 is formed. Further, a planarization process, such as a chemical mechanical polish (CMP), may remove any excess insulation material and form top surfaces of the insulation material 30 and a top surface of the fin that are co-planar.

Further in FIG. 5, the insulation material 30 is recessed to cause the fins, e.g., one or more of the first layers 26 and second layers 28 of the layer stack 24, to protrude from between neighboring isolation regions 30, which may be referred to as Shallow Trench Isolation (STI) regions. The isolation regions 30 may be recessed using an acceptable etching process, such as one that is selective to the insulation material 30. For example, a chemical oxide removal using a CERTAS® etch or an Applied Materials SICONI tool or dilute hydrofluoric (dHF) acid may be used. In some embodiments, after the recessing of the insulating material, the top surface of the insulation material is over and covers the cut fins (see FIG. 5).

A person having ordinary skill in the art will readily understand that the process described with respect to FIGS. 2 through 5 is just one example of how fins may be formed. In another embodiment, a dielectric layer can be formed over a top surface of the substrate 20; trenches can be etched through the dielectric layer; layer stacks 24 can be epitaxially grown in the trenches; and the dielectric layer can be recessed such that the layer stacks 24 protrude from the dielectric layer to form fins. In a further embodiment, trenches can be formed in the buffer layer 22 and/or the substrate 20 to form sacrificial fins; a dielectric layer can be formed in the trenches and over a top surface of the substrate 20; the sacrificial fins can be recessed to form recesses in the dielectric layer; layer stacks 24 can be epitaxially grown in the recesses; and the dielectric layer can be recessed such that the layer stacks 24 protrude from the dielectric layer to form fins.

Figure 6A:
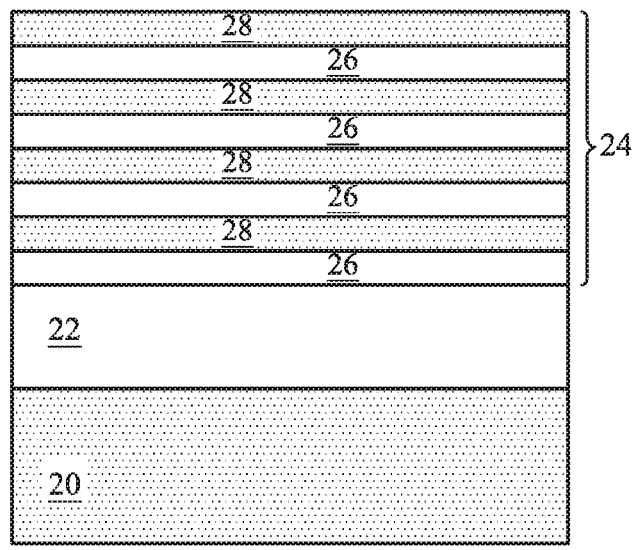
Figure 6B:
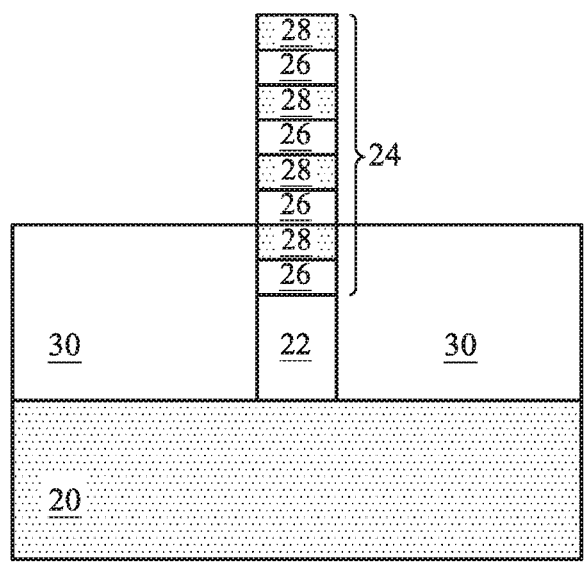

FIGS. 6A and 6B illustrate cross-sectional views of one of the fins extending through the insulating material 30 in FIG. 5 at the same point in processing as FIG. 5. FIGS. 7A through 15C illustrate the continued processing of the fin in FIGS. 6A and 6B.

Figure 7A:
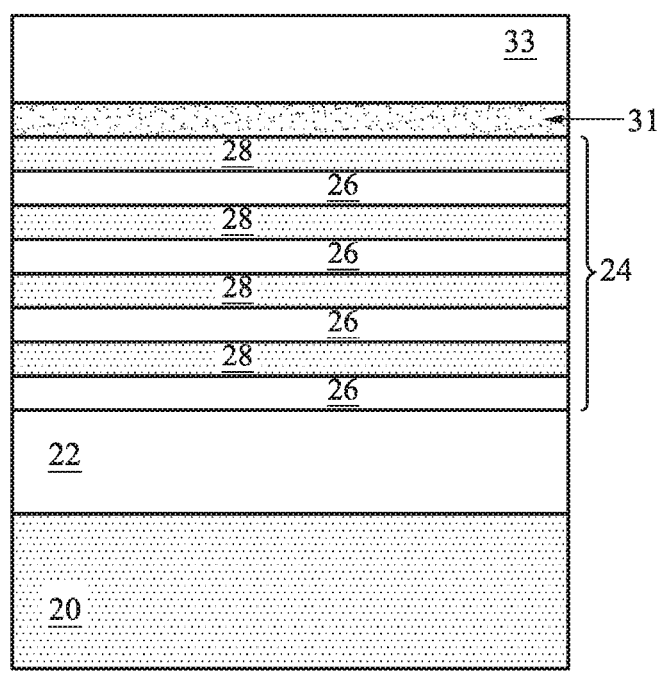
Figure 7B:
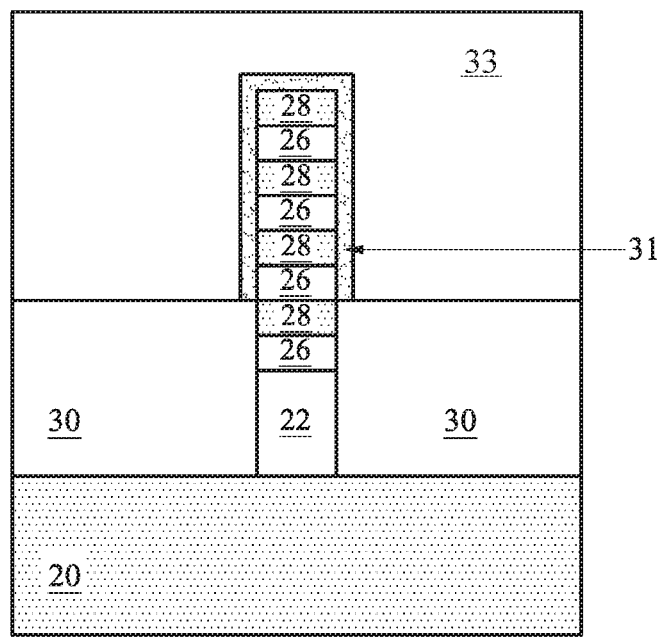
Figure 7C:
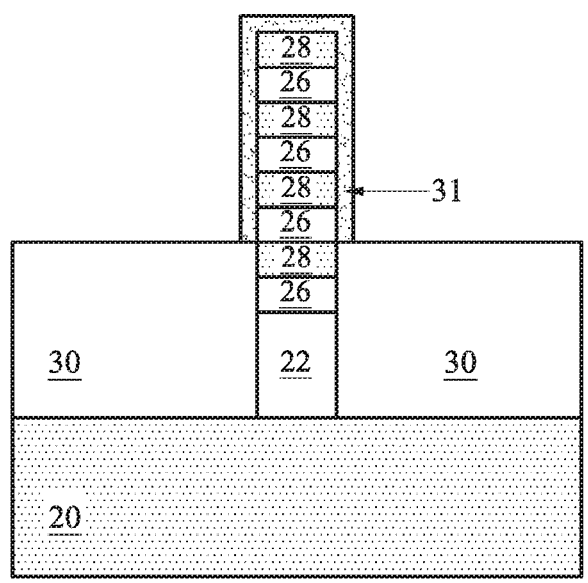

In FIGS. 7A, 7B, and 7C, a dummy dielectric layer 31 is formed on the fin. The dummy dielectric layer 31 may be, for example, silicon oxide, silicon nitride, a combination thereof, or the like, and may be deposited or thermally grown according to acceptable techniques, such as CVD, thermal oxidation, or the like. Further in FIGS. 7A, 7B, and 7C, a dummy gate layer 33 is formed over the dummy dielectric layer 31. The dummy gate layer 33 may be deposited, such as by using CVD or the like, over the dummy dielectric layer 31 and then planarized, such as by a CMP. The dummy gate layer 33 may comprise, for example, polysilicon, although other materials that have a high etching selectivity may also be used. Although not illustrated, a mask layer may be formed over the dummy gate layer 33. The mask layer may be deposited, such as by using CVD or the like, over the dummy gate layer 33. The mask layer may comprise, for example, silicon nitride, silicon oxynitride, silicon carbon nitride, or the like.

Figure 8A:
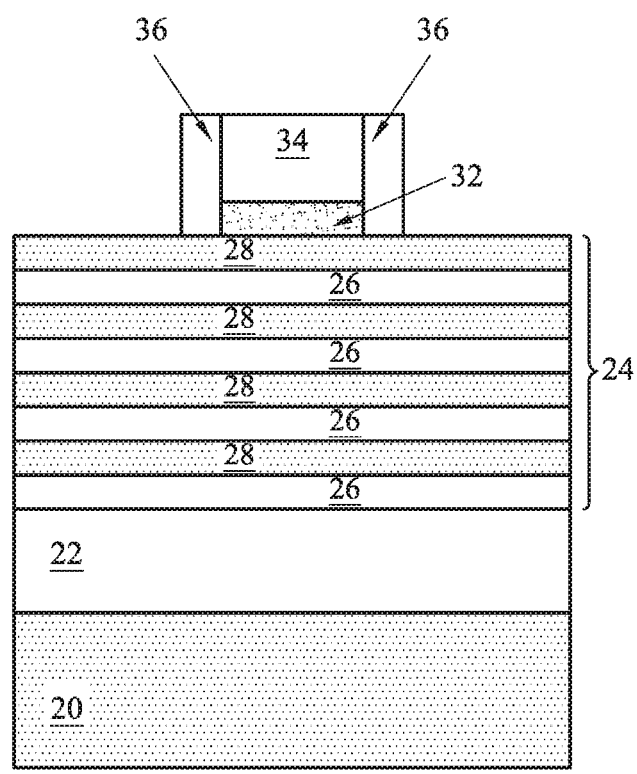
Figure 8B:
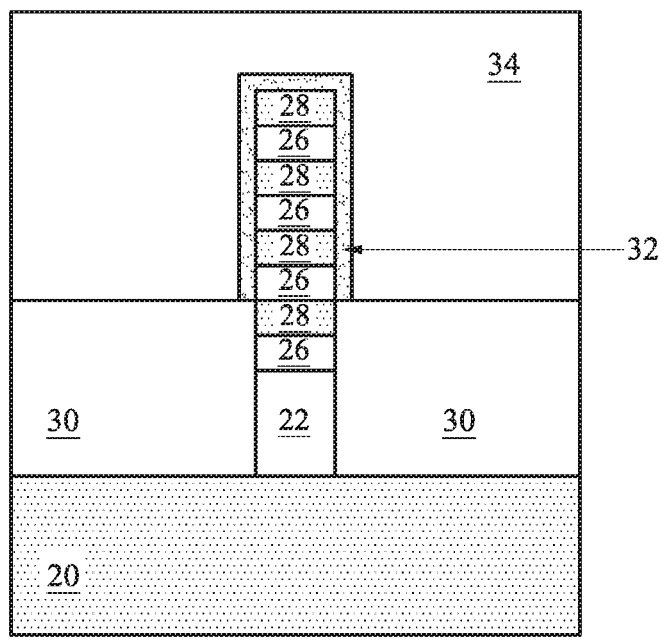
Figure 8C:
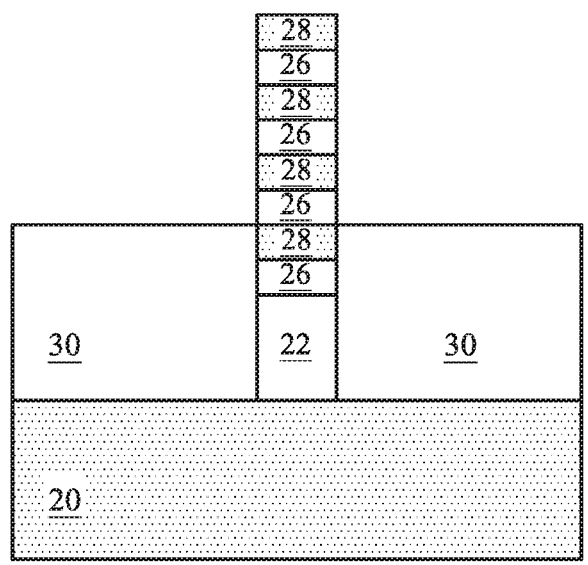

In FIGS. 8A, 8B, and 8C, the mask layer (if used) may be patterned using acceptable photolithography and etching techniques to form a mask. Further, the dummy gate layer 33 and dummy dielectric layer 31 may be patterned, such as by transferring the pattern of the mask, by using an acceptable etching technique to form a dummy gate 34 and dummy gate dielectric 32 from the dummy gate layer 33 and the dummy dielectric layer 31, respectively. The etching may comprise an acceptable anisotropic etching, such as RIE, NBE, or the like. The dummy gate 34 covers a channel region of the fin. The dummy gate 34 may also have a lengthwise direction substantially perpendicular to the lengthwise direction of the fin.

The removal of the dummy dielectric layer 31 and the dummy gate layer 33 exposes the layer stack 24 outside of the channel region (see, e.g., FIG. 8C). In some embodiments, the layer stacks 24 of the fins underneath the dummy gate 34 and the dummy gate dielectric 32 are not etched or removed and is substantially unchanged during and after the etch process.

Although not specifically illustrated, implants or plasma doping (PLAD) for lightly doped source/drain (LDD) regions may be performed. Similar to the implants discussed above, a mask, such as a photoresist, may be formed over the second region, e.g., for p-type devices, while exposing the first region, e.g., for n-type devices, and n-type impurities may be implanted or introduced by a plasma into an exposed fin in the first region. The mask may then be removed. Subsequently, a mask, such as a photoresist, may be formed over the first region while exposing the second region, and p-type impurities may be implanted or introduced by a plasma into an exposed fin in the second region. The mask may then be removed. The n-type impurities may be the any of the n-type impurities previously discussed, and the p-type impurities may be the any of the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

Further in FIGS. 8A, 8B, and 8C, gate spacers 36 are formed along sidewalls of the dummy gate 34 and dummy gate dielectric 32. The gate spacers 36 may be formed by conformally depositing, such as by CVD or the like, a material and subsequently anisotropically etching the material to remove the material outside of the sidewalls of the dummy gate 34 and dummy gate dielectric 32. The material of the gate spacers 36 may be silicon nitride, silicon carbon nitride, a combination thereof, or the like.

Figure 9A:
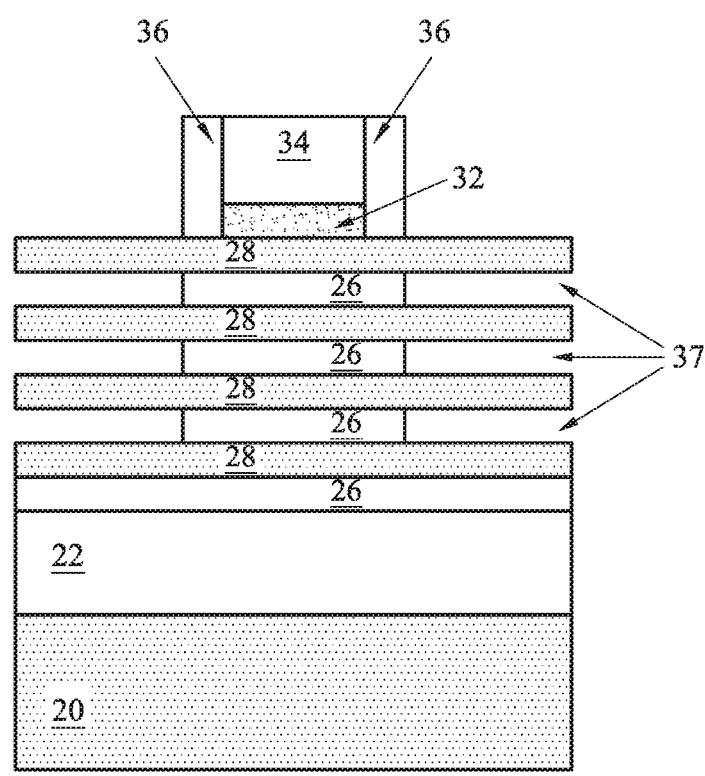
Figure 9B:
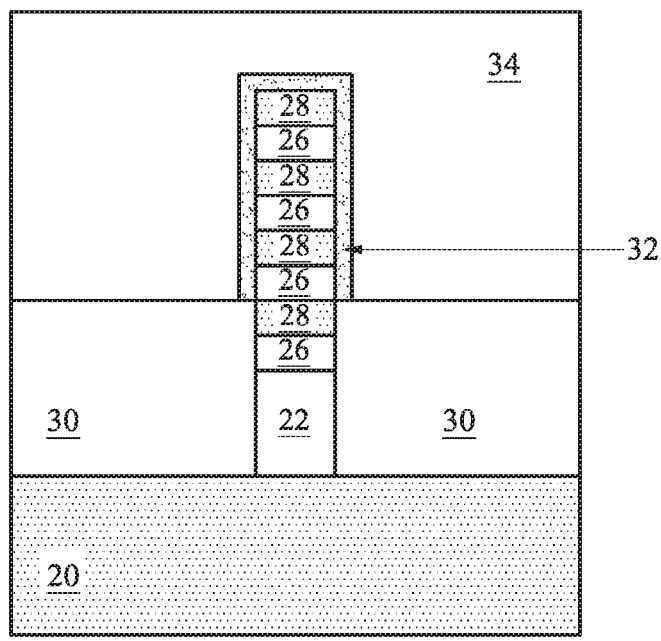
Figure 9C:
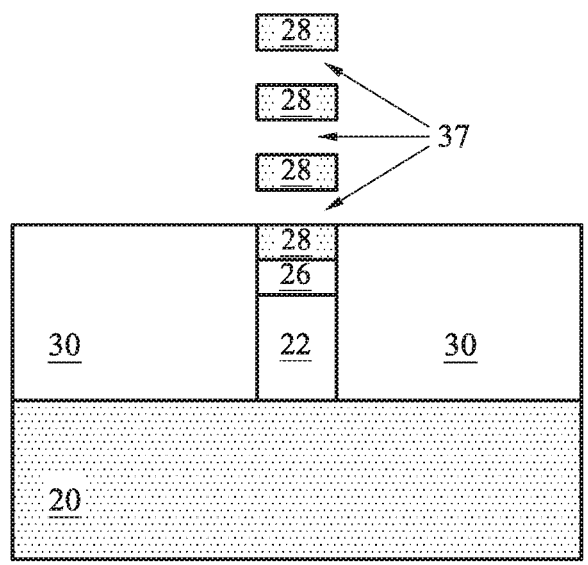

In FIGS. 9A, 9B, and 9C, the first layers 26 of the layer stack 24 outside of the dummy gate 34 and the dummy gate dielectric 32 are removed to form voids 37 (sometimes referred to as air gaps 37) between the remaining second layers 28. The removal of the first layers 26 may be through a selective etch process. In some embodiments, substantially only the first layers 26 of the layer stack 24 are etched. As a result of this etch the first layers 26 outside of the dummy gate 34 and the dummy gate dielectric 32 are removed. The etch process can be a wet etch process. In some embodiments, the etchant can be a wet etchant, such as a diluted ammonium hydroxide-hydrogen peroxide mixture (APM), sulfuric acid-hydrogen peroxide mixture (SPM), or the like. In some embodiments, the etch process can be a dry isotropic etch process. In some embodiments, the etchant of the dry etch can be a mixture of HCl gas, Cl$_2$ gas, and/or NF$_3$ gas, or the like. As one of skill will readily understand, a selectivity of HCl gas and Cl$_2$ gas can be modified by controlling a temperature and pressure of the etching process. Any other etch selective to the first layers 26 can be used. In some embodiments, the gate spacers 36 are not formed earlier in the process as described above, but are formed after the first layers 26 have been removed outside of the dummy gate 34 and the dummy gate dielectric 32.

Figure 10A:
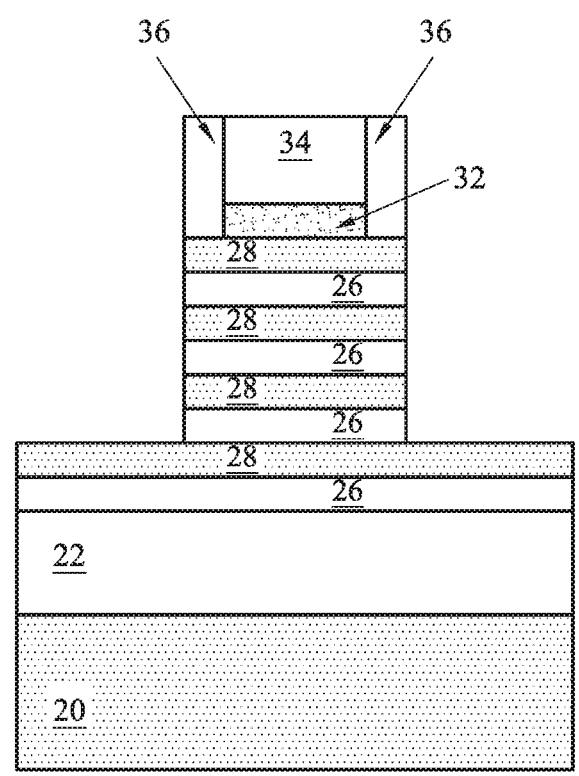
Figure 10B:
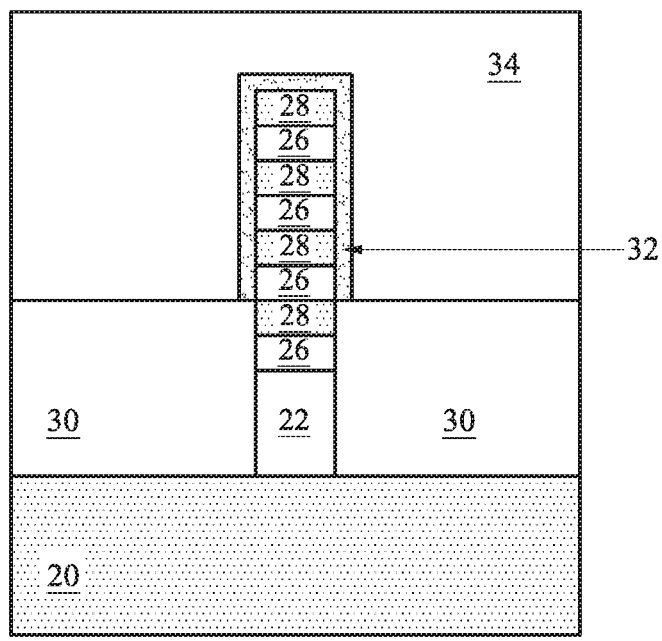
Figure 10C:
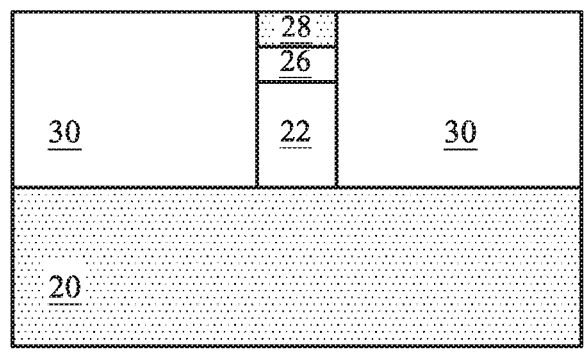

In FIGS. 10A, 10B, and 10C, the second layers 28 of the layer stack 24 outside of the dummy gate 34 and the dummy gate dielectric 32 are removed to form recesses in the fins. The recesses are formed in the source/drain regions of the fin such that the dummy gate 34 is disposed between the recesses. The recesses may be formed using any appropriate etch selective to the fin, e.g., layers of the layer stack 24 protruding from between the isolation regions 30. The etch process may be a dry etch process or a wet etch process. The recesses may be formed by etching using any acceptable etch process, such as a RIE, NBE, the like, or a combination thereof. In an embodiment, the recesses are formed in a plasma dry etch process. The dry etch may be anisotropic. In some embodiments, the recesses are formed in a wet etch process. This etch process may be any acceptable etch process, such as tetramethyalammonium hydroxide (TMAH), ammonium hydroxide (NH$_4$OH), a wet etchant capable of etching silicon with good etch selectivity between silicon and a material of the isolation regions and/or the gate seal spacers, the like, or a combination thereof. The wet etch may be isotropic. In some embodiments, the recess etch process is selective to the second layers 28 as those are the only layers remaining outside of the dummy gate 34 and the dummy gate dielectric 32.

By removing the first layers 26 to form voids 37 in the source/drain regions, the loading of the source/drain recessing process in FIGS. 10A through 10C is improved. In particular, embodiments such as those disclosed herein include a process flow that utilizes a multi-layered fin in the channel region (e.g. underneath the gate stack) and air gaps or voids outside of the channel region. These voids/air gaps between layers allows for the improvement of the etch process when recessing the fin for the source/drain regions. This improvement in the recessing step can improve the reliability, leakage, and yield of the FinFET device.

Figure 11A:
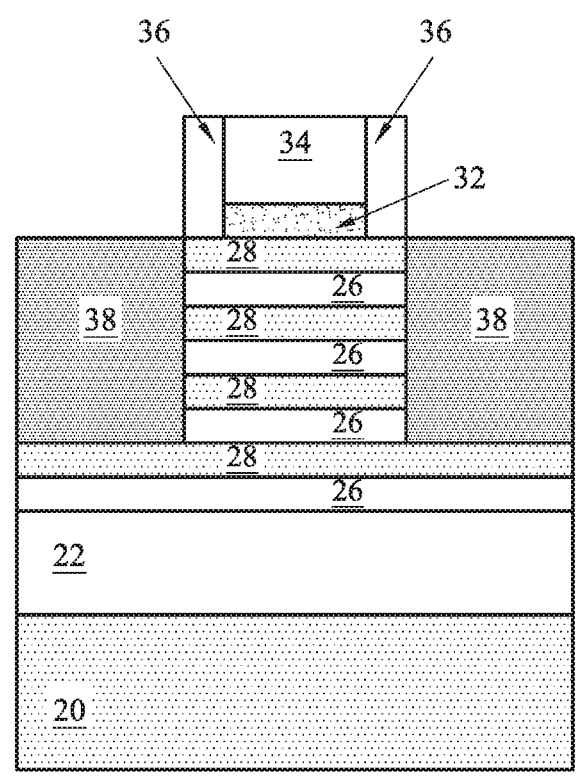
Figure 11B:
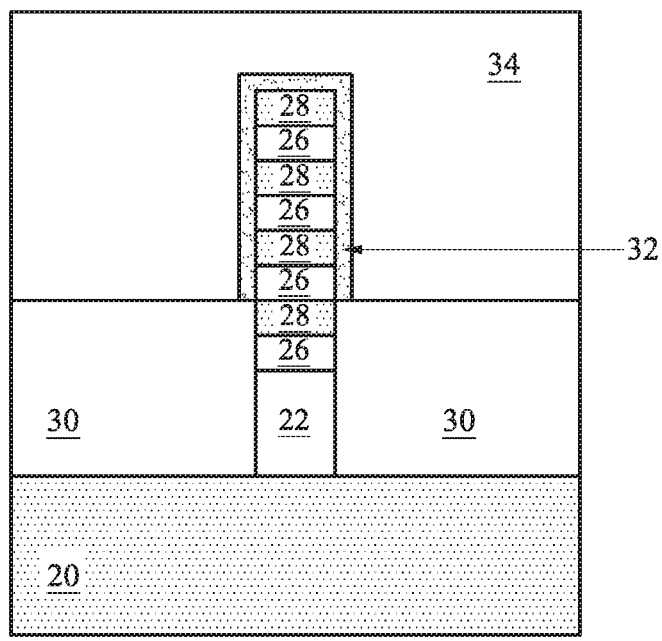
Figure 11C:
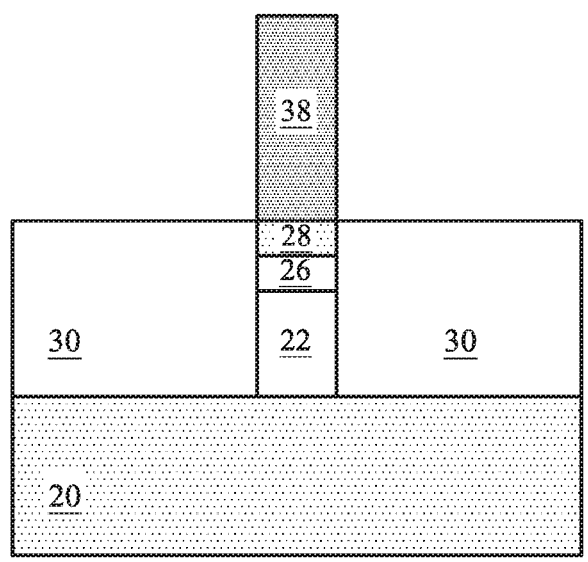

In FIGS. 11A, 11B, and 11C, after the recesses are formed, epitaxial source/drain regions 38 are then epitaxially grown in the recesses. The epitaxial source/drain regions 38 are formed in the source/drain regions of the fin such that the dummy gate 34 is disposed between the source/drain regions 38. The epitaxial growth may be by using MOCVD, MBE, LPE, VPE, the like, or a combination thereof. The epitaxial source/drain regions 38 may comprise any acceptable material, such as appropriate for the device type, e.g., n-type or p-type. For example, the epitaxial source/drain regions 38 for an n-type device may comprise silicon, SiC, SiCP, SiGeP, SiP, SiGeSnP, or the like, and the epitaxial source/drain regions 38 for a p-type device may comprise SiGe, SiGeB, Ge, GeB, GeSn, GeSnB, a boron-doped III-V compound material, or the like. The epitaxial source/drain regions 38 may have surfaces raised from respective outer surfaces of the fin and may have facets.

Although not specifically illustrated, different materials may be used for epitaxial source/drain regions 38 of a p-type device and epitaxial source/drain regions 38 of an n-type device in a complementary device. For example, a first region of the substrate 20 (e.g., where the n-type device is to be formed) can be masked by a first hard mask while a second region of the substrate 20 (e.g., where the p-type device is to be formed) is exposed and processed to form the epitaxial source/drain regions 38. The first hard mask can then be removed, and a second hard mask can be formed. The second region can be masked by the second hard mask while the first region is exposed and processed to form the epitaxial source/drain regions 38. The second hard mask can then be removed.

The epitaxial source/drain regions 38 of the fin may be implanted with dopants, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type impurities for source/drain regions for an n-type device in the first region may be any of the n-type impurities previously discussed, and the p-type impurities for source/drain regions in for the p-type device in the second region may be any of the p-type impurities previously discussed. In other embodiments, the epitaxial source/drain regions 38 may be in situ doped during growth.

Although not shown, the source/drain regions 38 of adjacent fins may merge to form a continuous epitaxial source/drain region. After the formation of the source/drain regions 38, a capping layer (not shown) may be formed on the source/drain regions 38. The capping layer may be considered part of the source/drain regions 38. In some embodiments, the capping layer is epitaxially grown on the source/drain regions 38. The capping layer helps to protect the source/drain regions 38 from dopant loss during the subsequent processing (e.g. etching processes, temperature processing, etc.). The topography of the source/drain regions 38 may be controlled to be non-planar.

Figure 12A:
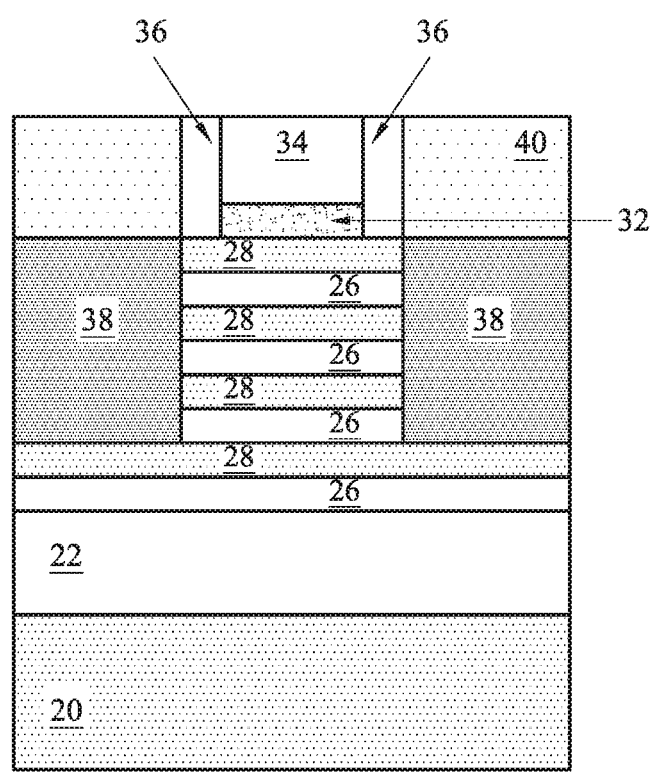
Figure 12B:
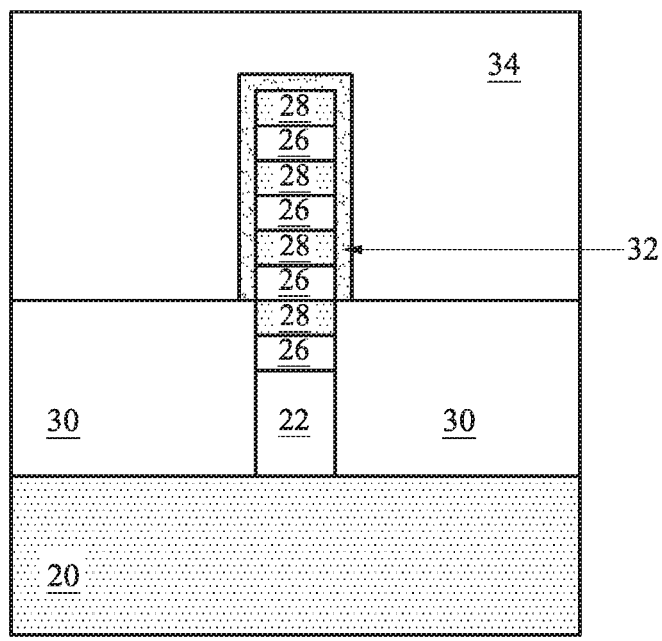
Figure 12C:
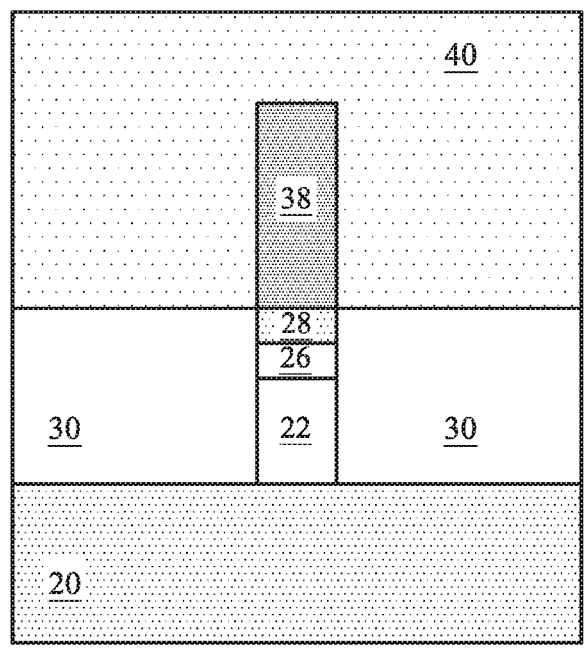

In FIGS. 12A, 12B, and 12C, a bottom inter-layer dielectric (ILD0) 40 is formed over the fin. The ILD0 40 can comprise a first layer, such as an etch stop layer (ESL) (not shown), conformally formed on the epitaxial source/drain regions 38, the gate spacers 36, the dummy gate 34 (or mask, if present), and the isolation regions 30. In some embodiments, the ESL may comprise silicon nitride, silicon carbonitride, or the like, formed using Atomic Layer Deposition (ALD), chemical vapor deposition (CVD), the like, or a combination thereof. The ILD0 40 can further comprise a second layer deposited over the first layer. The second layer of the ILD0 40 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Further in FIGS. 12A, 12B, and 12C, a planarization process, such as a CMP, is performed to level the top surface of ILD0 40 with the top surfaces of the dummy gate 34. The CMP may also remove the mask, if present, from over the dummy gate 34. Accordingly, a top surface of the dummy gate 34 is exposed through the ILD0 40.

Figure 13A:
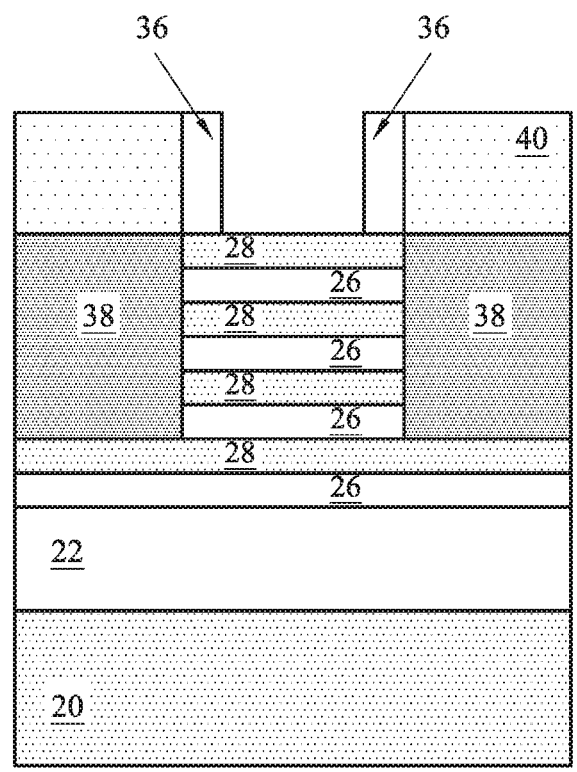
Figure 13B:
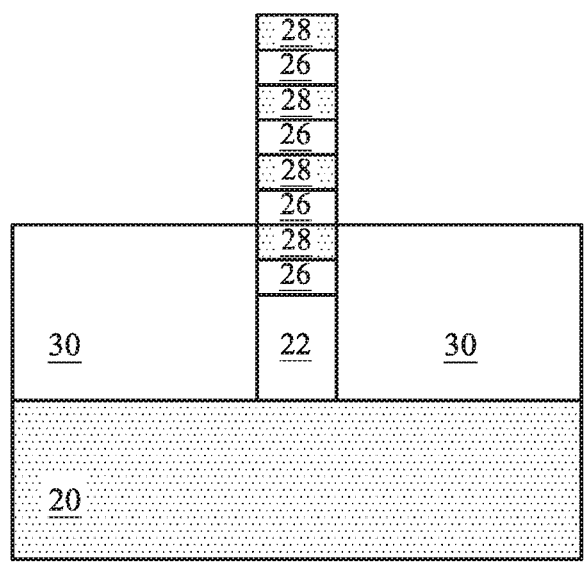
Figure 13C:
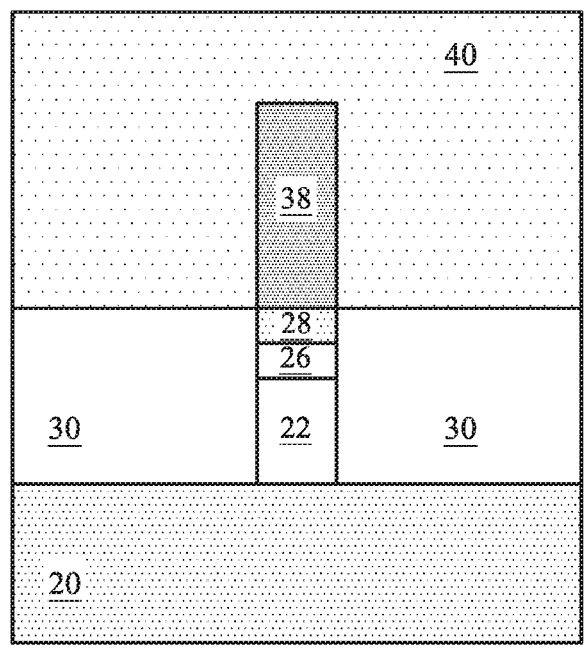

In FIGS. 13A, 13B, and 13C, the dummy gate 34 and the dummy gate dielectric 32 are removed in an etching step(s), so that an opening through the ILD0 40 and defined by the gate spacers 36 is formed to the fin, e.g., the layer stack 24. The opening exposes a channel region of the fin, e.g., the layer stack 24. The channel region is disposed between the neighboring pair of epitaxial source/drain regions 38. The etching step(s) may be selective to the materials of the dummy gate 34 and the dummy gate dielectric 32, which etching may be a dry or wet etching. During the etching, the dummy gate dielectric 32 may be used as an etch stop layer when the dummy gate 34 is etched. The dummy gate dielectric 32 may then be etched after the removal of the dummy gate 34.

Figure 14A:
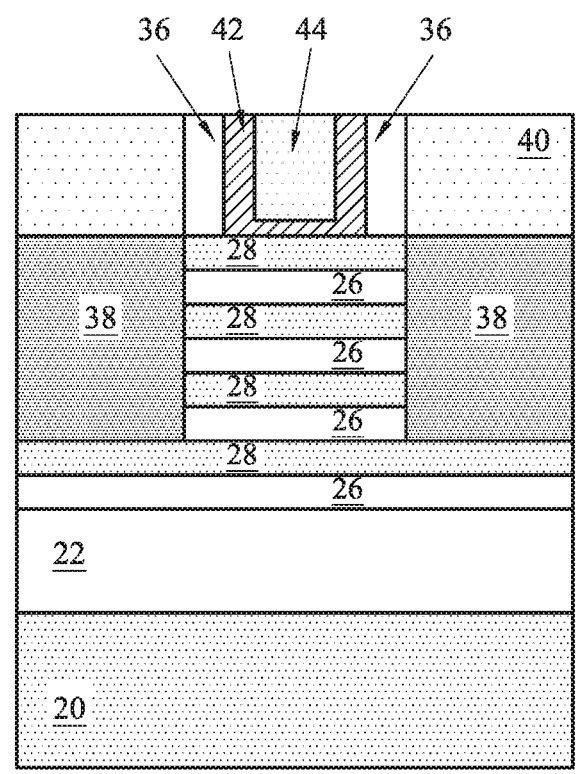
Figure 14B:
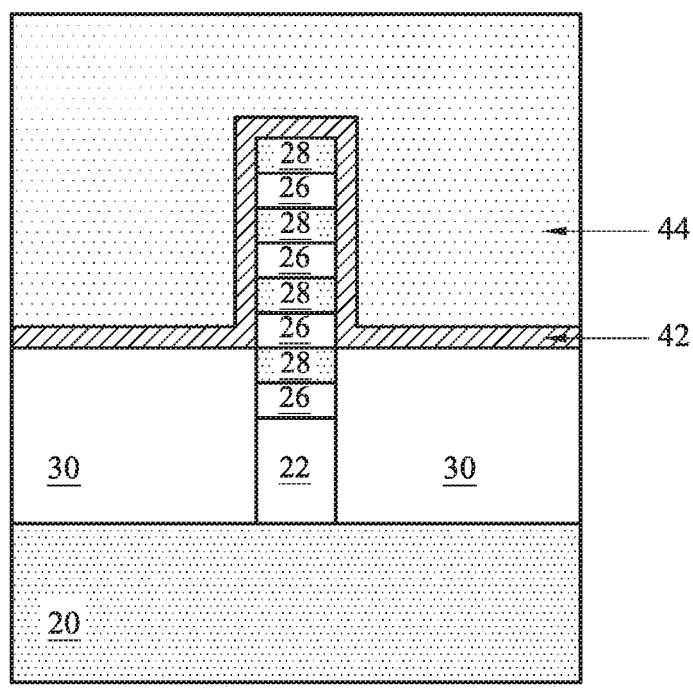
Figure 14C:
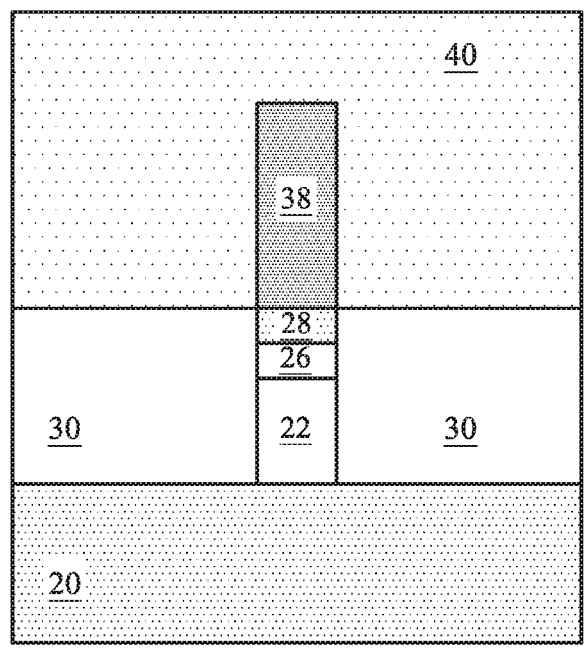

In FIGS. 14A, 14B, and 14C, a gate dielectric 42 and a gate electrode 44 are formed in the opening through the ILD0 40. The gate dielectric 42 can include an interfacial dielectric formed in the opening and on the fin. The interfacial dielectric may be, for example, an oxide or the like formed by thermal oxidation, ALD, CVD, or the like. The gate dielectric 42 can further include a high-k dielectric layer formed conformally on the top surface of the ILD0 40 and in the opening along sidewalls of the gate spacers 36 and on the interfacial dielectric. The high-k dielectric layer may have a k value greater than about 7.0, and may include a metal oxide or a silicate of Hf, Al, Zr, La, Mg, Ba, Ti, Pb, and combinations thereof. The formation methods of high-k dielectric layer may include ALD, CVD, Molecular-Beam Deposition (MBD), the like, or a combination thereof. Other embodiments contemplate other materials for the gate dielectric 42, such as materials that are not high-k.

The gate electrode 44 is formed on the gate dielectric 42. The gate electrode 44 can be a multi-layered structure. For example, the gate electrode 44 can include a capping layer conformally formed on the gate dielectric 42, one or more work function tuning layers conformally formed on the capping layer, and a metal-containing material, such as a metal, formed on the work function tuning layers and filling the opening. In an example, the capping layer can comprise a first sub-layer on the gate dielectric 42 formed of TiN or the like using ALD, CVD, or the like, and a second sub-layer on the first sub-layer formed of TaN or the like using ALD, CVD, or the like. The work function tuning layer(s) can be formed of TiAl, TiN, or the like using ALD, CVD, or the like. The metal-containing material can be tungsten (W), aluminum (Al), cobalt (Co), ruthenium (Ru), a combination thereof or the like deposited using CVD, physical vapor deposition (PVD), the like, or a combination thereof.

Next, a planarization process, such as a CMP, may be performed to remove the excess portions of gate electrode 44 and the gate dielectric 42, which excess portions are over the top surface of ILD0 40.

In FIGS. 14A, 14B, and 14C, an upper ILD (ILD1) 46 is deposited over the ILD0 40 and the gate electrode 44, and contacts 48 are formed through the ILD1 46 and ILD0 40 to the epitaxial source/drain regions 38. The ILD1 46 is formed of a dielectric material such as PSG, BSG, BPSG, USG, or the like, and may be deposited by any suitable method, such as CVD and PECVD. Openings for contacts 48 are formed through the ILD1 46 and ILD0 40. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1 46. The remaining liner and conductive material form contacts 48 in the openings. An anneal process may be performed to form a silicide at the interface between the epitaxial source/drain regions 38 and the contacts 48, respectively.

Figure 15A:
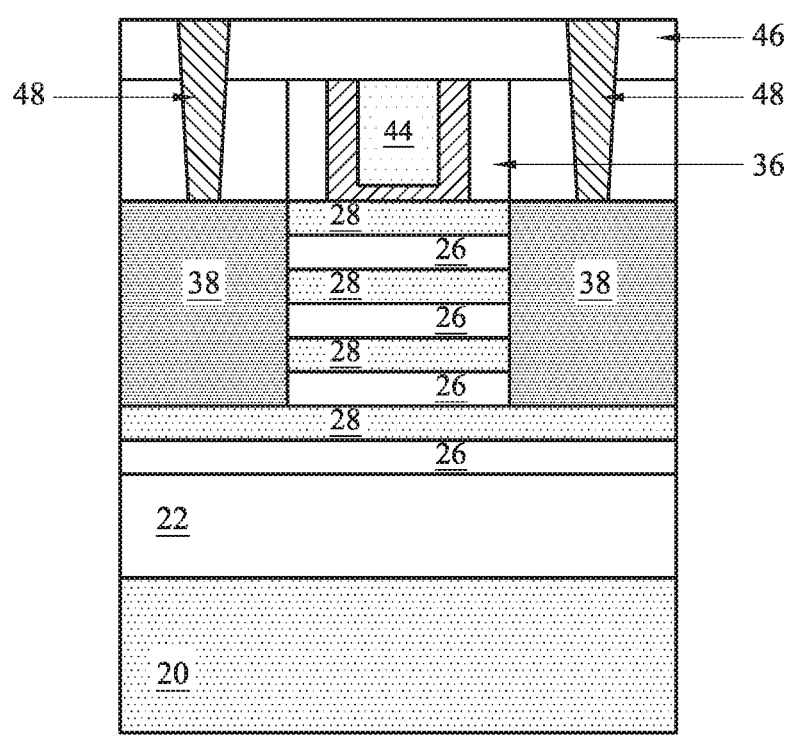
Figure 15B:
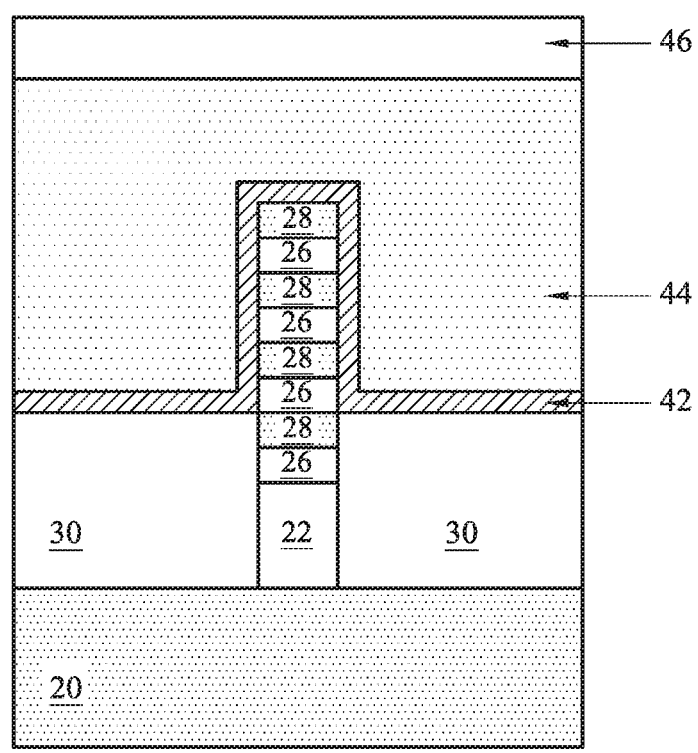
Figure 15C:
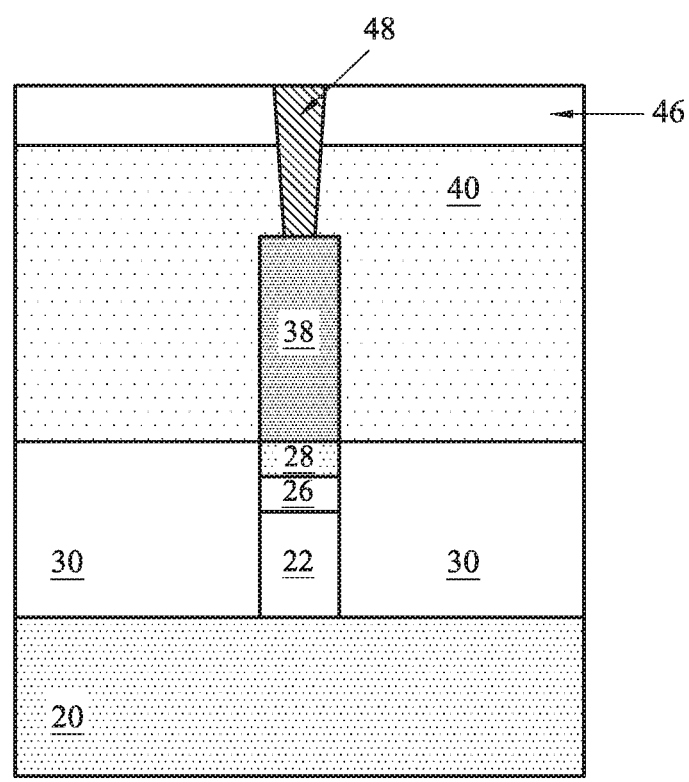

Although not explicitly shown, a person having ordinary skill in the art will readily understand that further processing steps may be performed on the structure in FIGS. 15A, 15B, and 15C. For example, various Inter-Metal Dielectrics (IMD) and their corresponding metallizations may be formed over ILD1 46.

The present disclosure includes a semiconductor device and method of forming the same to improve the reliability of FinFET devices by improving the fin patterning process. In addition, this process flow may improve the loading of the fin recess process when recessing the fins for the source/drain regions. In particular, embodiments such as those disclosed below include a process flow that utilizes a multi-layered fin in the channel region (e.g. underneath the gate stack) and air gaps or voids outside of the channel region. These voids/air gaps between layers allows for the improvement of the etch process when recessing the fin for the source/drain regions. Further, performing a fin cut process on multi-layered fins causes less stress on the fins as compared to fins comprising a single layer of material. These improvements in the fin cut process and the recessing steps can improve the reliability, leakage, and yield of the FinFET device.

An embodiment is a method including forming a fin over a substrate, the fin comprising alternating first layers and second layers, forming an isolation region surrounding the fin, an upper portion of the fin extending above a top surface of the isolation region, forming a first gate stack on sidewalls and a top surface of the upper portion of the fin, the first gate stack defining a channel region of the fin, selectively removing the first layers from the fin outside of the first gate stack, and removing the second layers from the fin outside of the first gate stack forming recesses in the fin, wherein after the removing the second layers, the channel region of the fin includes both the first layers and the second layers.

Another embodiment is a method including forming a multi-layer stack over a substrate, the multi-layer stack including alternating first layers and second layers, patterning the multi-layer stack to form a fin, forming an isolation region surrounding the fin, an upper portion of the fin extending above a top surface of the isolation region, forming a gate stack on sidewalls and a top surface of the upper portion of the fin, the gate stack defining a channel region of the fin, and removing the first layers from the fin outside of the gate stack, where after the removing the first layers, the channel region of the fin includes both the first layers and the second layers.

A further embodiment is a method including forming plurality of fins including a multi-layer stack, the multi-layer stack including alternating first layers and second layers, performing a fin cut process to remove some of the plurality of fins, where after the fin cut process, at least two fins remain, forming a first gate dielectric and a first gate electrode on sidewalls and a top surface of the at least two fins, the first gate dielectric and first gate electrode defining channel regions of the at least two fins, selectively etching the first layers of the multi-layer stack using the first gate dielectric and the first gate electrode as a mask, after selectively etching the first layers, etching the second layers using the first gate dielectric and the first gate electrode as a mask to form recesses in the at least two fins, after etching the second layers, epitaxially growing source/drain regions in the recesses of the at least two fins, and replacing the first gate dielectric and the first gate electrode with a second gate dielectric and a second gate electrode The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first fin extending from a substrate, the first fin comprising a multi-layer stack, the multi-layer stack comprising alternating first layers and second layers, wherein each of the first layers and the second layers are a crystalline material, wherein a natural lattice constant of the first layers is larger than a natural lattice constant of the second layers;
    a buffer layer between the substrate and the multi-layer stack, the buffer layer being a crystalline material and being lattice-mismatched to the substrate;
    an isolation region surrounding the first fin, an upper portion of the first fin extending above a top surface of the isolation region, the multi-layer stack extending below the top surface of the isolation region;
    a gate stack on sidewalls and a top surface of the upper portion of the first fin, the gate stack defining a channel region of the first fin, the channel region comprising the alternating first layers and second layers;
    source/drain regions on the first fin on opposing sides of the gate stack and the channel region; and
    conductive contacts over and electrically coupled to the source/drain regions.

2. The device of claim 1, wherein each of the first layers is compressively strained, and each of the second layers is tensilely strained.

3. The device of claim 1, wherein each of the first layers is tensilely strained, and each of the second layers is compressively strained.

4. The device of claim 1, wherein the multi-layer stack comprises strained layers.

5. The device of claim 1, wherein each of the first layers and the second layers have a first sidewall and a second sidewall, the first sidewalls being aligned along a first plane extending perpendicularly to the substrate, the second sidewalls being aligned along a second plane extending perpendicularly to the substrate.

6. The device of claim 1, wherein each of first layers is made of SiGe, and wherein each of the second layers is made of Si.

7. The device of claim 1 further comprising:
a dielectric layer over the isolation region, the first fin, the gate stack, and the source/drain regions; and
conductive contacts over and electrically coupled to the source/drain regions, the conductive contacts extending through the dielectric layer.

8. The device of claim 1, wherein the buffer layer is a relaxed layer.

9. A FinFET comprising:
a first fin extending from a substrate, the first fin comprising alternating first layers and second layers, wherein the first layers and second layers comprise strained layers;
an isolation region surrounding the first fin, an upper portion of the first fin extending above a top surface of the isolation region;
a gate stack on sidewalls and a top surface of the upper portion of the first fin, the gate stack defining a channel region of the first fin, the channel region including both the first layers and the second layers;
source/drain regions on the first fin on opposing sides of the gate stack and the channel region, the source/drain regions contacting the first layers and second layers of the channel region of the first fin;
conductive contacts over and electrically coupled to the source/drain regions; and
a buffer layer between the substrate and the alternating first layers and second layers, the buffer layer comprising SiGe and having a natural lattice constant smaller than a natural lattice constant of the first layers.

10. The FinFET of claim 9 further comprising:
a dielectric layer over the isolation region, the first fin, the gate stack, and the source/drain regions, the conductive contacts extending through the dielectric layer.

11. The FinFET of claim 9, wherein the first layers and second layers are vertically stacked.

12. The FinFET of claim 9, wherein each of the first layers and the second layers are a crystalline material, wherein a natural lattice constant of the first layers is different than a natural lattice constant of the second layers.

13. The FinFET of claim 9, wherein each of first layers is comprises SiGe, and wherein each of the second layers comprises Si.

14. The FinFET of claim 9, wherein the buffer layer is a relaxed layer.

15. A FinFET comprising:
a first fin extending from a substrate, the first fin comprising a stack of first semiconductor layers and second semiconductor layers, the stack of first semiconductor layers being alternatingly and vertically stacked with the second semiconductor layers, each of the first semiconductor layers and the second semiconductor layers being a crystalline material, wherein a natural lattice constant of the first semiconductor layers is different than a natural lattice constant of the second semiconductor layers;
a buffer layer between the substrate and the stack of first semiconductor layers and second semiconductor layers, the buffer layer being a crystalline material and being lattice-mismatched to the substrate;
an isolation region surrounding the first fin, an upper portion of the first fin extending above a top surface of the isolation region, the stack of first semiconductor layers and second semiconductor layers extending below the top surface of the isolation region;
a gate stack on sidewalls and a top surface of the upper portion of the first fin, the gate stack comprising a high-k gate dielectric with a metal gate electrode on the high-k gate dielectric;
a first epitaxial source/drain region on a first side of the gate stack, the first epitaxial source/drain region contacting a first semiconductor layer and a second semiconductor layer of the first fin; and
a second epitaxial source/drain region on a second side of the gate stack, the first side being opposite the second side, the second epitaxial source/drain region contacting a first layer and a second layer of the first fin.

16. The FinFET of claim 15, wherein each of the first semiconductor layers is compressively strained, and each of the second semiconductor layers is tensilely strained.

17. The FinFET of claim 15, wherein each of the first semiconductor layers is tensilely strained, and each of the second semiconductor layers is compressively strained.

18. The FinFET of claim 15, wherein the first semiconductor layers and the second semiconductor layers are strained layers.

19. The FinFET of claim 15, wherein each of first layers is made of SiGe, and wherein each of the second layers is made of Si.

20. The FinFET of claim 15, wherein the buffer layer is a relaxed layer.

* * * * *